United States Patent [19]

Himelick

[11] Patent Number: 4,853,345

[45] Date of Patent: Aug. 1, 1989

[54] PROCESS FOR MANUFACTURE OF A VERTICAL DMOS TRANSISTOR

[75] Inventor: James M. Himelick, Kokomo, Ind.

[73] Assignee: Delco Electronics Corporation, Kokomo, Ind.

[21] Appl. No.: 234,761

[22] Filed: Aug. 22, 1988

[51] Int. Cl.$^4$ .................... H01L 21/22; H01L 21/78
[52] U.S. Cl. ..................... 437/41; 437/147; 437/153; 437/228
[58] Field of Search .............. 437/41, 915, 152, 187, 437/203, 228, 147, 153; 357/23.4

[56] References Cited

U.S. PATENT DOCUMENTS

| | | | |
|---|---|---|---|
| 4,372,034 | 2/1983 | Bohr | 437/228 |
| 4,443,931 | 4/1984 | Baliga et al. | 437/152 |
| 4,502,069 | 2/1985 | Schuh | 357/23.4 |
| 4,503,598 | 3/1985 | Vora et al. | 29/571 |
| 4,516,143 | 5/1985 | Love | 357/23.4 |
| 4,561,168 | 12/1985 | Pitzer et al. | 437/78 |
| 4,716,126 | 12/1987 | Cogan | 437/41 |
| 4,774,198 | 9/1988 | Contiero et al. | 437/30 |
| 4,785,344 | 11/1988 | Franz | 357/23.4 |
| 4,798,810 | 1/1989 | Blanchard et al. | 437/41 |

OTHER PUBLICATIONS

G. Bell and W. Ladenhauf, "SIPMOS Technology, an Example of VLSI Precision Realized with Standard LSI for Power Transistors," Siemens Forsch.-u. Entwickl.-Ber. Bd. 9(1980), Nr. 4, Springer-Verlag 1980.

Primary Examiner—Brian E. Hearn
Assistant Examiner—Tuan Nguyen
Attorney, Agent, or Firm—Robert J. Wallace

[57] ABSTRACT

A process for forming a vertical n-channel DMOS transistor uses a common deposition step to form a phosphorus-rich predeposit simultaneously over the polysilicon gate electrode, over a central surface portion of a p-well region and over the back surface drain region of the chip. This predeposit is followed by a common drive-in step to form an n-type source region within the p-well region, and to make the polysilicon gate electrode and the back surface more conductive. In addition, the process uses the source region contact mask as a shadow mask for anistropically etching a via hole in the source region so that the source metallization can also contact the p-well region and serve also as a shorting contact to the p-well.

7 Claims, 4 Drawing Sheets

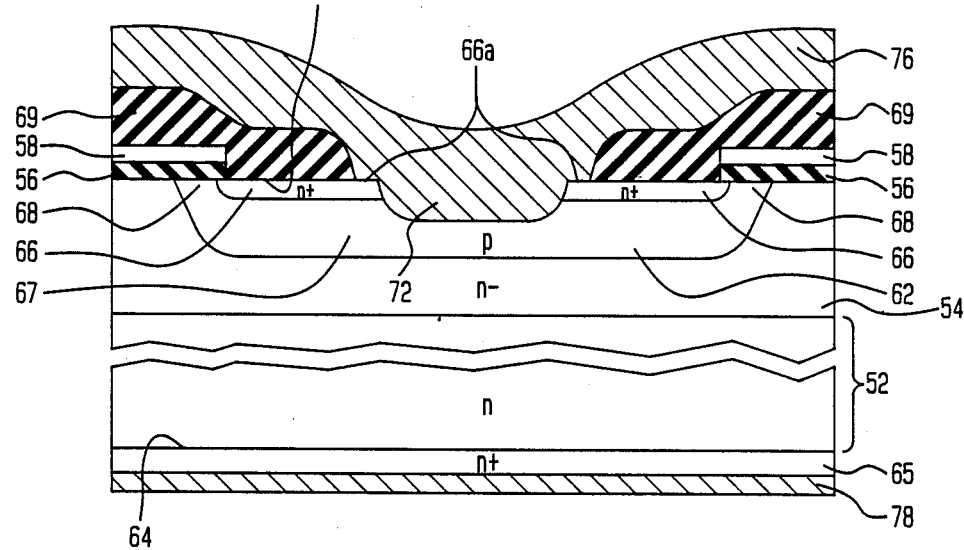

PROCESS FOR MANUFACTURE OF A VERTICAL DMOS TRANSISTOR

FIELD OF THE INVENTION

This invention relates to semiconductive devices and more particularly to the manufacture of an MOS (metal-oxide-semiconductor) device of the type known as a DMOS transistor.

BACKGROUND OF THE INVENTION

DMOS transistors, particularly of the vertical type, are of increasing importance as power transistors. A vertical DMOS transistor basically includes source and drain regions of one conductivity type on opposite surfaces of a semiconductive chip and a gate region of the opposite conductivity type on one surface between the source and drain regions. The gate region characteristically has been formed by diffusion of a first dopant into that portion of the chip to locally reverse there the original conductivity type. Typically this diffusion is first used to form a well within which there later is diffused a second dopant of the type opposite the first dopant to form an enclosed region or island of the original conductivity type that serves as the source region.

Appropriate voltages applied to an insulated doped-polysilicon gate electrode localized over a surface of this gate region induce a surface channel of the opposite conductivity type which effectively electrically connects together the source and drain regions. This facilitates a vertical current flow through the transistor between the drain and source regions on opposite surfaces of the chip. Typically the vertical DMOS structure utilizes an electrode to the source region that also electrically contacts or shorts to the diffused gate region.

In a typical conventional process for fabricating such a vertical DMOS device, at least two separate steps are used in doping appropriately the polysilicon gate electrode, the source region and the backside of the chip where the drain electrical contact is made. Additionally, usually the formation of the shorting source contact is a relatively complex operation involving many steps. These all add to the number of steps required in the manufacture of a DMOS type. Typically the cost increases and the yield decreases as the number of steps in the manufacture of a semiconductor device increases.

The present invention seeks to reduce the number of steps used in the manufacture of a semiconductor device.

SUMMARY OF THE INVENTION

To this end, a first feature of a process for the manufacture of a transistor in a semiconductive chip having front (top) and back (bottom) surfaces in accordance with the invention is the use of a single step for doping simultaneously a polysilicon gate electrode, a source region formed within a diffused gate well and the back surface of the chip where a drain electrode is to be provided. This reduces the total number of steps involved as compared to some prior art processes. As a second feature, a mask used to define the shorting source region contact is also used as a shadow mask to define a via in an enclosed source region to the underlying diffused gate region. This permits the shorting contact to the source region to also make contact to the underlying diffused gate region.

The invention will be better understood from the following more detailed description taken with the accompanying drawing.

BRIEF DESCRIPTION OF THE DRAWING

FIGS. 2A through 2H show a portion of a silicon wafer in various stages of manufacture, in accordance with an illustrative embodiment of the invention, into the DMOS transistor shown in FIG. 1.

It is to be noted that the drawings are not to scale since the vertical dimensions generally are much smaller than the horizontal dimensions.

DETAILED DESCRIPTION

Figure 1:
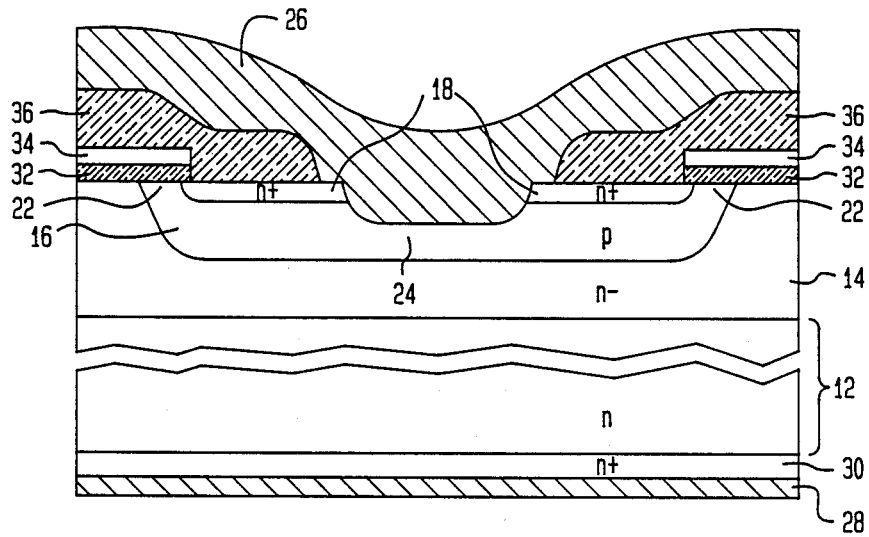
FIG. 1 shows in cross section a DMOS transistor of the kind to whose manufacture the invention is directed.

Referring now to FIG. 1, there is shown an n−channel vertical DMOS transistor 10 which is part of a silicon chip whose bulk 12 is of n−type conductivity. Transistor 10 is designed for use as a power transistor. Typically this chip was part of a wafer of much larger surface area in which many like transistors were formed simultaneously. In the interest of simplicity, it is convenient to show the processing of only a single transistor, but it should be understood that normally many such transistors will be formed in a wafer by a common set of steps. Typically the bulk (substrate) 12 of the chip is a moderately low resistivity n−type monocrystalline silicon substrate 12 on which has been grown epitaxially a higher resistivity n−type layer 14. Within this layer 14 there is formed a diffused p−type well 16. Well 16 in turn includes on a front surface thereof a relatively low resistivity n+ type annular island source region 18. A via through source region 18 exposes a central portion (region) 24 of the well 16. The portion of well 16 between vertical outer edges of region 18 and layer 14 defines a p−type annular portion (region) 22 of well 16 between the n+ type island region 18 and the n−type layer 14. In operation, the conductivity type of portion 22 of well 16 is inverted and then serves as an n−type channel which electrically connects region 18 to layer 14. Portion 22 is usually denoted as the channel portion of well 16. Portion 24 of the well 16, which is not inverted, is usually denoted as the body diode portion of well 16.

A first electrode 26 on the front surface of the chip makes direct contact both to the annular n+ type source region 18 and to the body diode portion 24 of well 16. A second electrode 28 on the back surface of the chip makes contact to the n−type bulk (substrate) portion 12 of the chip. Generally, to desirably decrease the resistance of the latter contact, the back surface of the chip is doped with n−type dopants to form an n+ type surface layer 30 and electrode 28 contacts layer 30. Electrodes 26 and 28 serve as the source and drain electrodes, respectively.

As is characteristic of an MOS transistor, a silicon oxide (typically essentially silicon dioxide) layer 32 overlies portions of the front surface of the chip, including particularly the channel portion (region) 22 of the p−type well 16.

On this oxide layer 32 and overlying the annular region 22, there is a gate electrode 34 which is typically polycrystalline silicon. Gate electrode 34 is generally doped to be heavily n−type, to set a desired threshold voltage for the inversion of region 22 to n−type conductivity so as to selectively electrically connect region 18 to layer 14. Although not shown in the drawing, the overlying metal layer that forms the source electrode 26 will be appropriately patterned to permit connection to be made to the gate electrode 34 so that gate voltages may be applied to it.

An insulating layer 36, typically of phosphosilicate glass, serves as an insulating layer to isolate the polysilicon gate electrode 34 from the source electrode 26. The preparation of such a transistor in accordance with an illustrative embodiment of the invention will now be described with reference to FIGS. 2A through 2H.

Figure 2A:
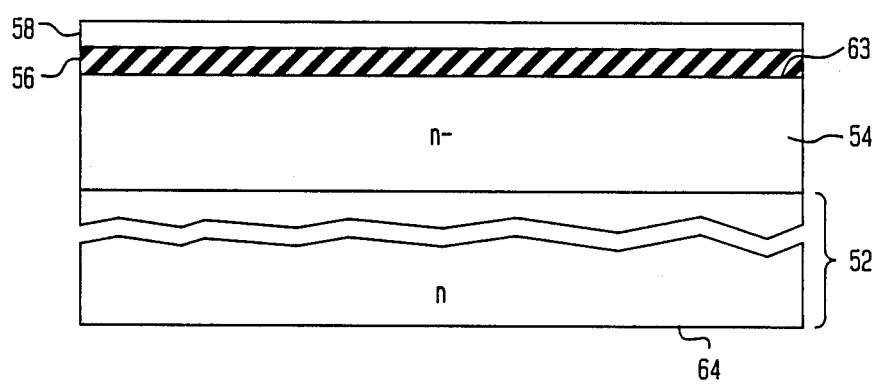

Referring now to FIG. 2A, there is shown a silicon wafer 50 of which only a portion adequate to provide a silicon chip including a single transistor is shown. Wafer 50 includes a moderately doped n—type substrate portion 52 (typically about $10^{18}$ donors per cubic centimeter) of sufficient thickness (typically about 25 mils) to provide mechanical strength and ruggedness to the wafer 50. An epitaxial layer 54 (typically $10^{17}$ microns) of n—type conductivity (typically $10^{17}$ donors per cubic centimeter) is grown over wafer 50. Then generally a relatively thick field oxide layer is formed over the wafer, usually by heating in an oxidizing ambient for an appropriate time. This oxide layer is then patterned by photolithographic techniques to remove this thick layer both from a back (bottom) surface 64 of the wafer 50 and from selected front (top) surface regions 63 of the wafer 50 where active devices are to be formed. Since only the portion of the wafer 50 in which a transistor is to be formed is shown in FIG. 2A, the described thick oxide layer is not seen since it has been removed from the shown portion of surface region 63 of wafer 50.

Then a new layer 56 of silicon oxide (typically essentially silicon dioxide), relatively thin to be suitable for use as a gate oxide, is grown over such exposed front surface 63 of the wafer 50. In an illustrative embodiment, this layer is about 1000 Angstroms thick, as compared to a field oxide layer thickness of about 6000 Angstroms. This is followed by the deposition over layer 56 of a polycrystalline silicon layer 58 which is initially relatively free of doping and typically is about 4500 Angstroms thick. Any of various known techniques can be employed for such deposition.

Figure 2B:
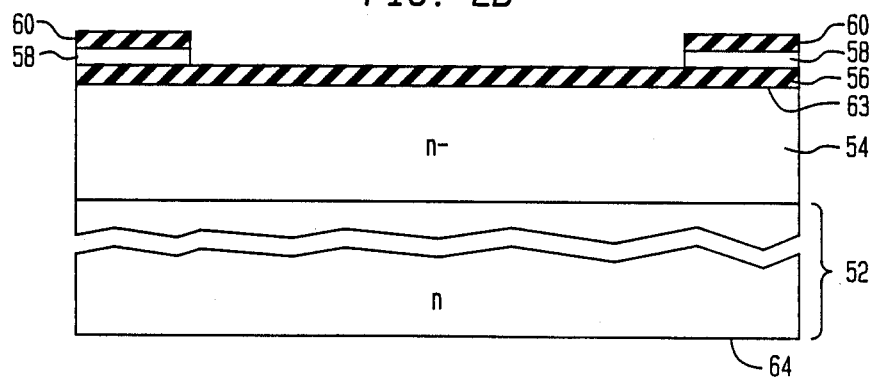

The polysilicon layer 58 on the front surface 63 is thereafter masked by a layer of a photoresist 60 which is thereafter patterned photolithographically. Then the exposed polysilicon is etched away to leave the polysilicon layer 58 correspondingly patterned as shown in FIG. 2B.

Figure 2C:
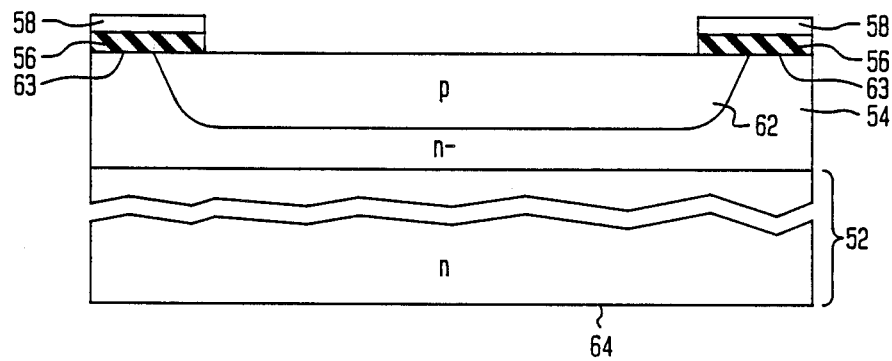

The polysilicon 58 and its overlying photoresist 60 are then used as a mask for the implantation of the wafer 50 with acceptor ions, typically boron at about 100 kiloelectron volts. Next the photoresist 60 is stripped off the wafer 50, typically either by etching in a sulfuric acid bath or in an oxygen plasma. The wafer 50 is then heated to drive the implanted boron ions deeper into the wafer 50 to form a moderately doped p—type well 62. The result is shown in FIG. 2C. Typically the well 16 is several microns deep with a surface sheet resistivity of about 600 ohms per square. There then is stripped from the back surface 64 of the wafer 50 any polysilicon and oxide that may have formed there. Alternatively, such stripping may be done before the boron drive-in heating.

The patterned polysilicon 58 is advantageously also used as a mask to remove the portion of the thin silicon oxide layer 56 exposed in the polysilicon pattern to arrive at the structure shown in FIG. 2C. It should be noted that the drive-in heating step has extended the edge of the p—type diffusion well 62 laterally so that a portion of the well 62 underlies the polycrystalline layer 58.

Then in a common predeposition step, a donor, advantageously phosphorus, is introduced over the exposed front surfaces of well 62, the polysilicon layer 58 and the back surface 64 of the substrate 52. This typically involves heating the wafer in a phosphorus-rich ambient to introduce a controlled amount of phosphorus shallowly in such regions. This is then followed by further heating at a higher temperature in a phosphorus-free ambient to drive the shallow phosphorus deposit deeper.

Figure 2D:
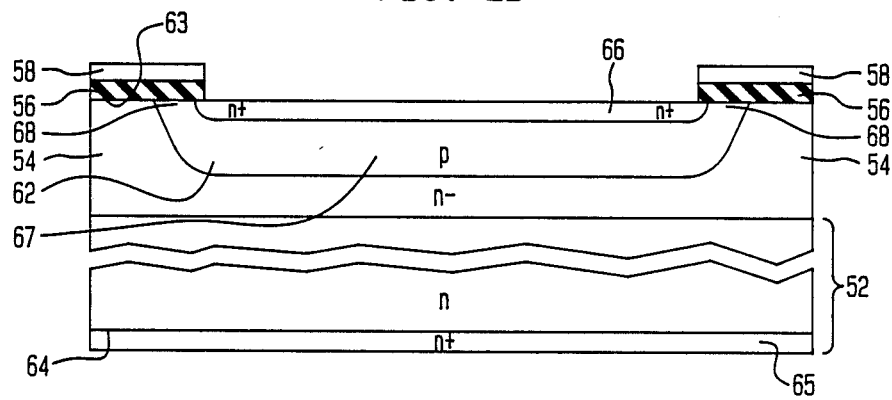

First, this serves to form at the surface of the well 62 a relatively heavily doped n+ type source region 66, whose edge just underlies the polysilicon layer 58 and is separated from it by gate oxide layer 56. Typically this source region is about 0.4 micron deep with a surface sheet resistivity of about 20 ohms per square. However, there remains unconverted an annular surface portion 68 of p—well 62 that underlies the polysilicon layer 58. Portion 68 of well 62 serves as the channel (typically about 1.5 microns wide) of the DMOS between the source region 66 and the layer 54 which is part of the drain region. The remaining portion 67 of well 62 serves as the body diode. The result is seen in FIG. 2D.

Second, the phosphorus introduction serves to provide n—type conductivity to the polysilicon layer 58 and better adapts it to serve as the gate electrode of the DMOS.

Third, the phosphorus introduction into the back surface 64 forms there a more heavily doped layer 65 (surface sheet resistivity of about 20 ohms per square). Layer 65 is useful to facilitate the making of a low resistance connection thereto and reduces the need for grinding such back surface before the backside drain electrode 78 (shown in FIG. 2H) is deposited thereover.

Figure 2E:
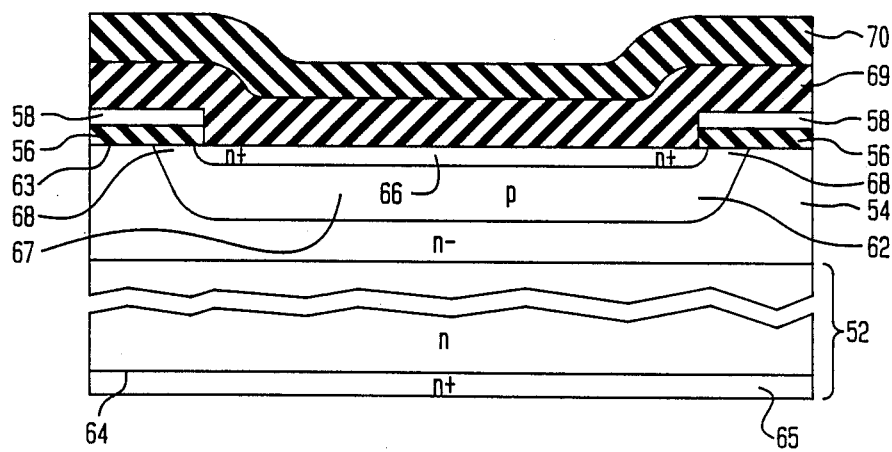

Next, as seen in FIG. 2E, there is deposited over the front surface 63 of the wafer 50 an insulating layer 69 which is used to isolate the polysilicon electrode 58 from the subsequent source electrode metallization (shown in FIG. 2H as electrode 76). The forming of layer 69 typically involves depositing a phosphosilicate glass at a relatively low temperature followed by heating at a higher temperature to densify the glass. Next, a layer of photoresist 70 is deposited over the phosphosilicate glass 69.

Figure 2F:
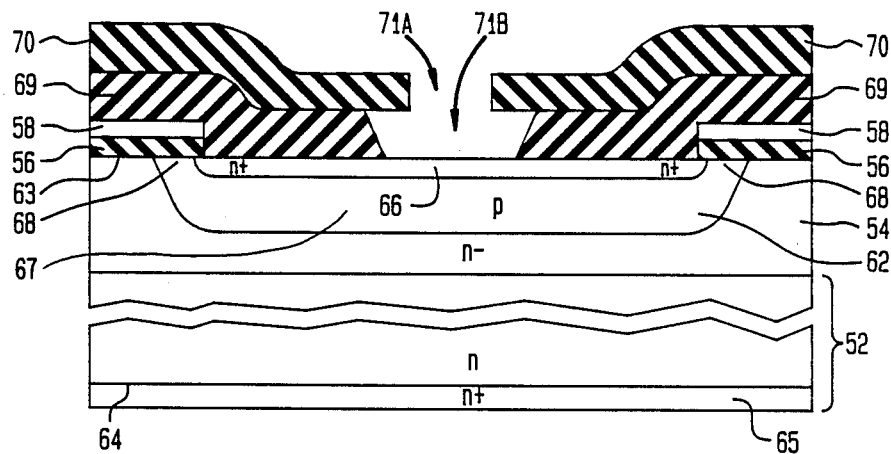

Then, as is shown in FIG. 2F, the photoresist layer 70 is first patterned to form an opening 71A (typically 5 microns wide) in it for use as a mask in patterning the phosphosilicate glass layer 69. Then the glass layer 69 is patterned to provide an opening 71B in the layer 69. For patterning the glass layer 69, an isotropic wet etchant is used to insure some undercutting of the patterned photoresist layer 70 to provide for opening 71B which has a width of about 7 microns.

Figure 2G:
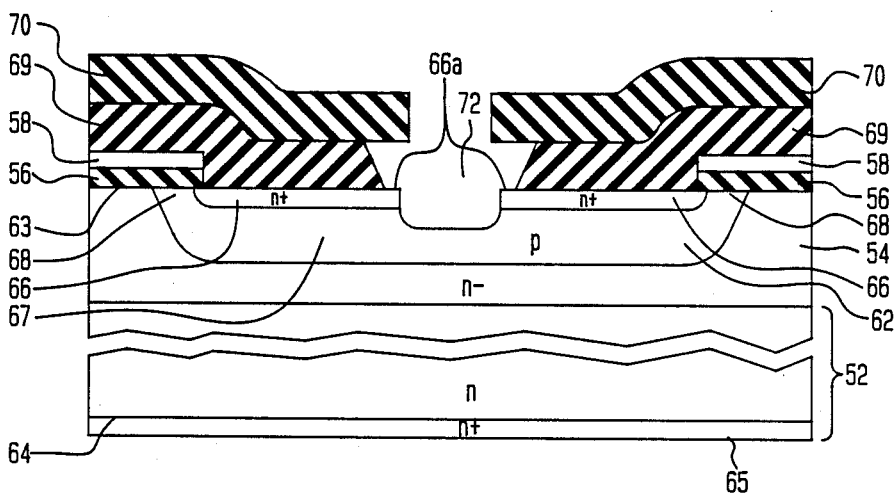

Next, as is shown in FIG. 2G, with the patterned photoresist layer 70 still in place to act as a shadow mask, the front face 63 of the wafer 50 is exposed to a gas plasma, typically SF6. This etches substantially anisotropically to form a via 72 (typically about 5 microns wide) through a central portion of the layer 66 and exposes a central body diode portion of the p—type well 62. An edge portion 66a of the layer 66 exposed by the previously mentioned undercutting in the patterned phosphosilicate layer 69 is left in place.

This plasma etch is chosen to provide a via 72 which substantially conforms in area to the area originally defined by the edge of the opening 71A in the photoresist masking layer 70. It is chosen also to leave sloping curved walls in the via which are less vertical than would result from a more anisotropic reactive ion etch. Such curved sloping in the sidewalls of the via 72 is desirable to permit better filling of the via 72 by the subsequent metallization. A known SF6 plasma is useful to provide such etching.

Advantageously, the wafer 50 is then exposed to a buffered oxide etch for selectively etching the glassy layer 69 and widening its opening to about 9 microns to increase the amount of n—type source region 66 that will contact the source electrode 76 (see FIG. 2H).

Next, as is shown in FIG. 2H, after photoresist layer 70 is removed, there is deposited over the front surface a conductive layer 76, typically of aluminum. This fills the via 72 and forms direct contact both to the exposed central portion of the p—type well 62 and to the exposed vertical edge and horizontal edge 66A of the via 72 formed in the source region 66. This layer 76 serves both as the source electrode and as an electrical short between the source region 66 and a body diode portion of well 62.

The metal layer 76 is then etched in conventional fashion in a desired pattern that includes openings (not shown) to permit contact to be made to the polysilicon gate electrode 58. Next, one would usually heat the wafer 50 to alloy the remaining aluminum to the silicon, which improves the electrical contact therebetween.

Normally a silicon nitride passivating layer (not shown) would then be provided over the now built up front surface 63. This layer is then appropriately patterned to expose pads to which leads may be bonded Then a conductive layer 78 is deposited over the phosphorus-doped layer 65 to serve as the drain electrode. Conductive layer 78 is preferably nickel when the conductive layer 78 is to be soldered to a header member that is to be used in an automobile. In other applications other conductors, such as aluminum, can be used as layer 78. Before such deposit, it has usually been advantageous to grind the back surface to roughen the surface to facilitate making a low resistance connection. However, the earlier phosphorous doping to form heavily doped layer 65 at such surface, as described, may eliminate or at least reduce, the amount needed of such grinding. The resultant is shown in FIG. 2H. This structure is the same as that shown in FIG. 1 with different reference numerals.

For the sake of brevity in the forgoing description, there has been omitted mention of the usual cleaning steps normally performed after the etching, implantation, diffusion and deposition steps to remove undesirable by-products of such steps.

Reviewing briefly, a first feature of the preferred embodiment of the invention involves stripping the back surface of the wafer to bare such back surface earlier than was customary in the past. Subsequently, a common phosphorous diffusion operation can be used to form a heavily doped layer on the bared back surface, to dope the polysilicon gate electrode layer, and to form the n—type source region. This permits elimination of at least one mask operation from previous practice.

Additionally, a second feature of the invention is the use of the source region contact mask as a shadow mask in the substantially anisotropic etching of a via through the n—type source region to the underlying body diode region of the underlying p—type well. This permits a later deposited source electrode to also serve as a shorting contact to this body diode region.

It is to be understood that the specific embodiment described is merely illustrative of the general principles involved and that other structures are feasible and still consistent with the spirit and scope of the invention. For example, with the conductivity types of the n—channel DMOS transistor reversed, it becomes a p-channel DMOS transistor. Similarly, specific details, such as the materials used for doping and for the contacts or the dimensions involved, may be different. Moreover, while the order of some of the steps in the process described is critical, the order of others is discretionary, as should be apparent to a skilled worker in the art.

The embodiments of the invention in which an exclusive property or privilege is claimed are defined as follows:

1. A process for making a semiconductive device comprising the steps of:
   preparing a silicon wafer of one conductivity type having opposed front and back surfaces;
   forming over the front surface and insulated therefrom a patterned polysilicon layer suitable for use as a silicon gate electrode;
   using the polysilicon layer as a mask for forming over the front surface a surface well having a conductivity type opposite said one type;
   doping simultaneously with dopant ions of the type characteristic of the one-type a surface portion of said surface well, the polysilicon layer and the back surface of the water, which had been previously stripped of any polysilicon or oxide;
   driving in said dopants to form a source region of the one conductivity type at the surface of the well region, leaving unconverted a channel portion and a body diode portion of the well region, and to increase the conductivity of the polysilicon layer and of the back surface; and
   providing a source electrode contacting both the source region and the body diode portion and providing a drain electrode contacting the back surface.

2. The process of claim 1 in which the providing of the source electrode includes:
   forming an insulating layer over the front surface and the patterned polysilicon layer;
   providing a masking layer over said insulating layer;
   forming an opening in said masking layer over a central portion of the source region;
   etching isotropically the insulating layer through the opening in the masking layer to form an opening in the insulating layer that undercuts the masking layer and exposes a portion of the source region at such opening;
   etching substantially anisotropically the exposed portion of the source region to form a via, through the source region to the underlying body diode portion of the well region, whose area essentially corresponds to that of the opening in the masking layer; and
   depositing a conductive layer for use as the source electrode that contacts the source region along the side and top edges of the via and the body diode portion of the well region by way of the via.

3. A process for making a vertical DMOS transistor comprising the steps of:

preparing a silicon wafer of one conductivity type with front and back surfaces;

forming on the front surface a silicon oxide gate layer; forming over said silicon oxide layer a patterned polysilicon layer suitable for use as a silicon gate electrode;

forming in a portion of the front surface of the wafer a surface well of the opposite conductivity type using the patterned polysilicon gate as a mask;

stripping the back surface of the wafer and the exposed surface of the well region of the gate oxide layer;

exposing the silicon wafer to an ambient of dopants of the conductivity type predominant in the wafer simultaneously to form a source region of the one conductivity type at the surface of the well region, to dope the polysilicon layer to adapt it for use as the gate electrode, and to open the back surface of the wafer to facilitate the provision thereto of a drain electrode; and forming source and drain electrodes to the source region and the back surface of the bulk portion, respectively.

4. The process of claim 3 in which the forming of source electrode to the source region includes the steps of:

forming an insulating layer over the front surface;

forming over said insulating layer a masking layer defining an aperture overlying the source region;

etching the insulating layer isotropically through the aperture in the masking layer for forming an opening in the insulating layer larger than said aperture for exposing a portion of the source region;

etching substantially anisotropically the source region for forming a via to the underlying well region of area substantially corresponding to that of the aperture in the masking layer;

stripping away the masking layer; and depositing a metal layer for use as the source electrode over said insulating layer for filling the opening in the insulating layer, thereby contacting the well region by way of the via in the source region and the source region along the vertical and lateral edges of the via.

5. In a process of making a DMOS transistor that comprises a source electrode that contacts both a central portion of a body diode portion of a well region of one conductivity type and an annular source region of the opposite conductivity type surrounding said central portion, the steps of:

forming, on a first surface of a semiconductive wafer whose bulk is of one conductivity type, a well region of the opposite conductivity type that surrounds an island surface region which is of the one conductivity type and is useful as a source region;

depositing an insulating layer over said first surface;

depositing a masking layer over said insulating layer;

forming an opening in the masking layer overlying a central portion of the island surface region;

etching the insulating layer through the opening in the masking layer in a manner to undercut the masking layer and form an opening in the insulating layer of an area larger than the opening in the masking layer;

etching the wafer through the openings in the masking and insulating layers to form a via through a central portion of said island surface region of an area substantially corresponding to the area of the opening in the masking layer, leaving exposed edge portions of the via;

stripping the masking layer; and depositing a layer suitable for use as the source electrode over the insulating layer through the opening in the insulating layer and the via in the island surface region to contact both the island surface region at the exposed edges of the via and the underlying body diode portion of the well region through the via in the island surface region.

6. The process of claim 5 in which the etching of the insulating layer through the opening in the masking layer uses an isotropic wet etchant while the etching of the wafer to form a via uses a plasma etch that is substantially anisotropic.

7. The process of claim 6 which includes after the etching of the wafer and before the stripping of the masking layer the step of etching the insulating layer selectively to further expose the island surface region around the periphery of the via.

* * * * *